United States Patent

Patel

(10) Patent No.: US 10,242,747 B1
(45) Date of Patent: Mar. 26, 2019

(54) CHARGE LOSS FAILURE MITIGATION

(71) Applicant: MICRON TECHNOLOGY, INC., Boise, ID (US)

(72) Inventor: Vipul Patel, Santa Clara, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/856,132

(22) Filed: Dec. 28, 2017

(51) Int. Cl.
*G11C 16/26* (2006.01)
*G11C 16/10* (2006.01)
*G11C 16/30* (2006.01)
*G11C 16/04* (2006.01)

(52) U.S. Cl.
CPC .......... *G11C 16/26* (2013.01); *G11C 16/0483* (2013.01); *G11C 16/10* (2013.01); *G11C 16/30* (2013.01)

(58) Field of Classification Search
CPC ............ G11C 11/5614; G11C 11/5664; G11C 11/5678; G11C 13/0004; G11C 13/0011; G11C 13/0014; G11C 13/0023; G11C 13/0028; G11C 16/08; G11C 16/26; G11C 16/30; G11C 16/3445

USPC ........... 365/230.06, 230.08, 185.18, 185.22, 365/185.24, 210.12, 230.01
See application file for complete search history.

(56) References Cited

U.S. PATENT DOCUMENTS

| 8,904,250 B2 | 12/2014 | Falanga et al. |
| 2008/0253217 A1* | 10/2008 | Taeuber .............. G11C 11/5614 365/230.06 |

* cited by examiner

*Primary Examiner* — Thong Q Le
(74) *Attorney, Agent, or Firm* — Dicke, Billig & Czaja, PLLC

(57) ABSTRACT

Methods of operating a memory include reading a particular grouping of memory cells using a read voltage having a particular voltage level, determining a number of memory cells of a subset of memory cells of the particular grouping of memory cells having a particular data state, and, if the number of memory cells of the subset of memory cells having the particular data state is less than a particular threshold, adjusting a voltage level of the read voltage in response to the number of memory cells of the subset of memory cells having the particular data state and reading the particular grouping of memory cells using the read voltage having the adjusted voltage level.

24 Claims, 9 Drawing Sheets

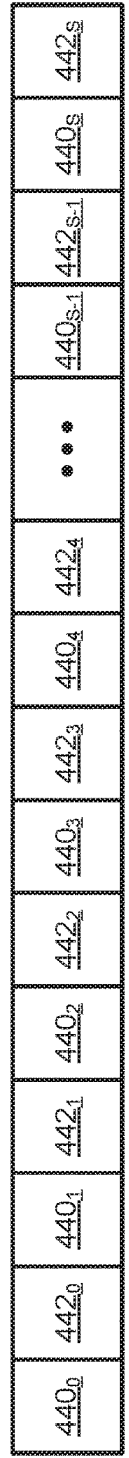
FIG. 4A
FIG. 4B

US 10,242,747 B1

CHARGE LOSS FAILURE MITIGATION

TECHNICAL FIELD

The present disclosure relates generally to memory and, in particular, in one or more embodiments, the present disclosure relates to methods of operating memory for mitigating charge loss failure.

BACKGROUND

Integrated circuit devices traverse a broad range of electronic devices. One particular type include memory devices, oftentimes referred to simply as memory. Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). An MLC uses more than two Vt ranges, where each Vt range indicates a different data state. Multiple-level cells can take advantage of the analog nature of a traditional charge storage cell by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In some cases, memory cells of a memory might be pre-programmed with data prior to connecting that memory to other circuitry. Connecting a memory to other circuitry may cause thermal stress to the memory. For example, where reflow soldering techniques are used to connect a memory to a circuit board, the circuit board and memory would generally be subjected to high levels of heat in order to melt, i.e., reflow, the solder joints to make the desired connections. Thermal stress may cause changes in the threshold voltages of the pre-programmed memory cells through charge loss, which may result in shifting and/or widening of the threshold voltage distributions of the memory cells representing the various data states. Similarly, extended use of a memory might also result in charge loss. For example, memory is increasingly being used in embedded applications expected to exhibit usage life significantly longer than a typical solid-state drive or mobile phone application, such as in the automotive industry where infotainment, instrument cluster, engine control and driver assistance systems are increasingly reliant on such memories. Where threshold voltage distributions shift and/or widen too much, a memory cell may indicate a data state other than its intended data state. At some point, this charge loss can cause read errors for an end-user, and may ultimately cause a memory to become, or be deemed, unusable.

BRIEF DESCRIPTION OF THE DRAWINGS

FIGS. 4A-4B illustrate examples of data structures that might be used with embodiments.

DETAILED DESCRIPTION

Figure 1:
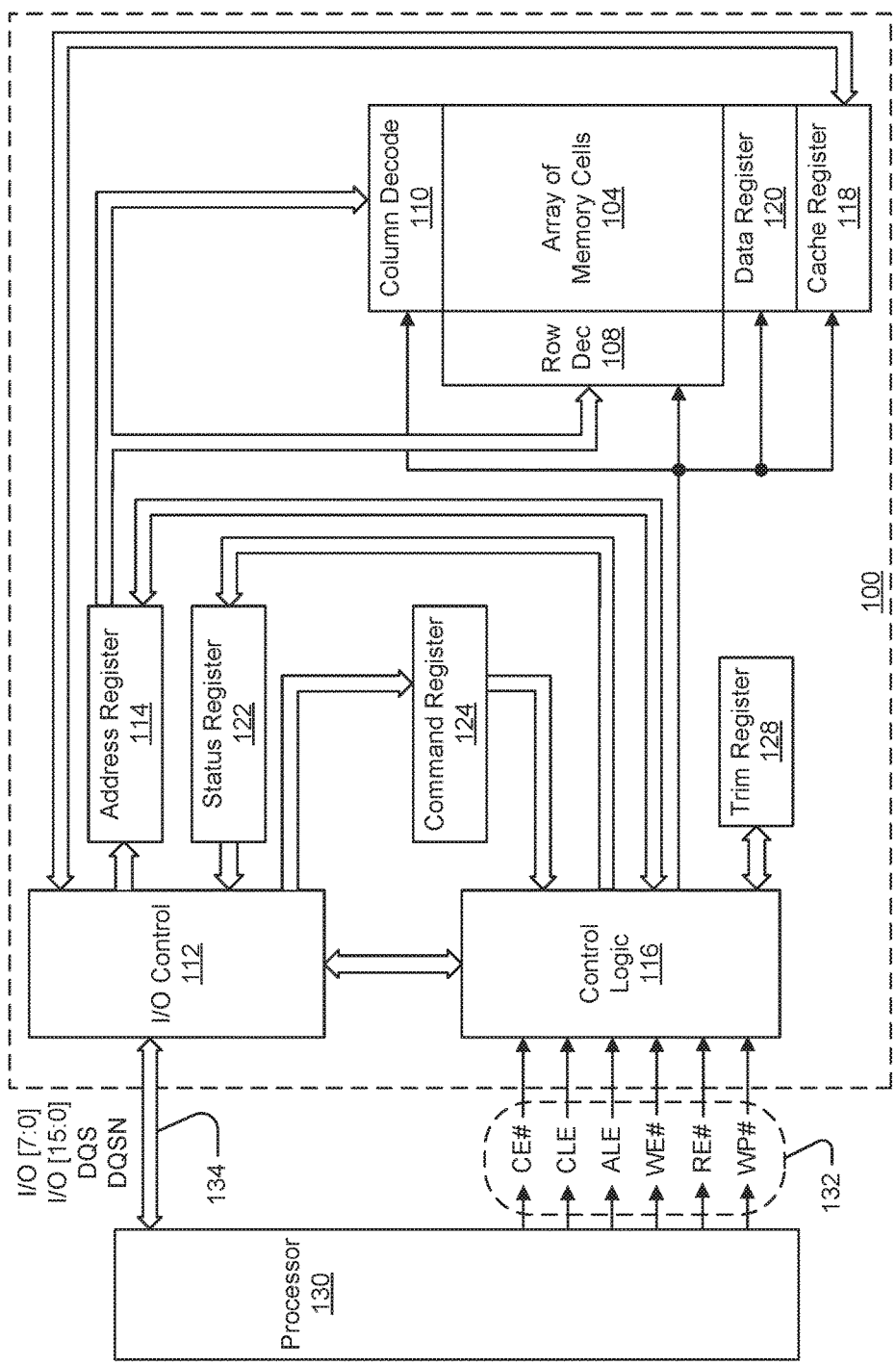
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

FIG. 1 is a simplified block diagram of a first apparatus (e.g., an integrated circuit device), in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands. A trim register 128 may be in communication with the control logic 116 to store trim settings. Although depicted as a separate storage register, trim register 128 may represent a portion of the array of memory cells 104. Trim settings are generally values used by an integrated circuit device to define values of voltage levels, control signals, timing parameters, quantities, options, etc. to be used during operation of that integrated circuit device.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) and other operations in accordance with embodiments described herein. The control logic 116 is in communication with row decode circuitry 108 and column decode circuitry 110 to control the row decode circuitry 108 and column decode circuitry 110 in response to the addresses.

Control logic 116 may also be in communication with a cache register 118. Cache register 118 may latch data, either incoming or outgoing, as directed by control logic 116 to temporarily store data while the array of memory cells 104 is busy writing or reading, respectively, other data. During a program operation (e.g., write operation), data may be passed from the cache register 118 to data register 120 for transfer to the array of memory cells 104; then new data may be latched in the cache register 118 from the I/O control circuitry 112. During a read operation, data may be passed from the cache register 118 to the I/O control circuitry 112 for output to the external processor 130; then new data may be passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE#, a command latch enable CLE, an address latch enable ALE, a write enable WE#, a read enable RE#, and a write protect WP#. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands may be received over input/output (I/O) pins [7:0] of I/O bus 134 at I/O control circuitry 112 and may be written into command register 124. The addresses may be received over input/output (I/O) pins [7:0] of I/O bus 134 at I/O control circuitry 112 and may be written into address register 114. The data may be received over input/output (I/O) pins [7:0] for an 8-bit device or input/output (I/O) pins [15:0] for a 16-bit device at I/O control circuitry 112 and may be written into cache register 118. The data may be subsequently written into data register 120 for programming the array of memory cells 104. For another embodiment, cache register 118 may be omitted, and the data may be written directly into data register 120. Data may also be output over input/output (I/O) pins [7:0] for an 8-bit device or input/output (I/O) pins [15:0] for a 16-bit device. The I/O bus 134 might further include complementary data strobes DQS and DQSN that may provide a synchronous reference for data input and output. Although reference may be made to I/O pins, they may include any conductive node providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
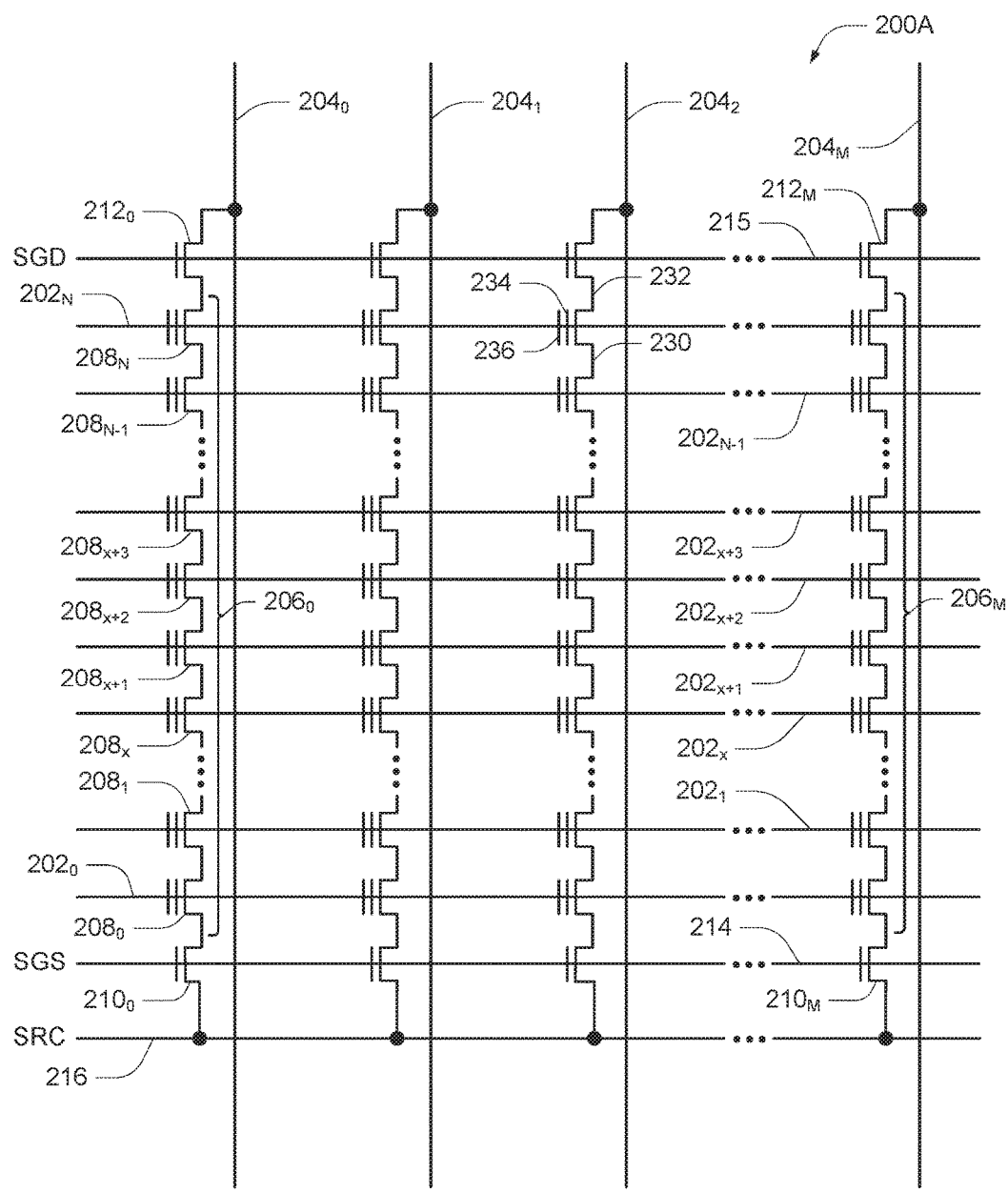
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and data lines, such as bit lines $204_0$ to $204_M$. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines $204_0$, $204_2$, $204_4$, etc.) may be one physical page of memory cells 208 (e.g., even memory cells) while memory cells 208 commonly connected to word line $202_N$ and selectively connected to odd bit lines 204 (e.g., bit lines $204_1$, $204_3$, $204_5$, etc.) may be another physical page of memory cells 208 (e.g., odd memory cells). Although bit lines $204_3$-$204_5$ are not explicitly depicted in FIG. 2A, it is apparent from the figure that the bit lines 204 of the array of memory cells 200A may be numbered consecutively from bit line $204_0$ to bit line $204_M$. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
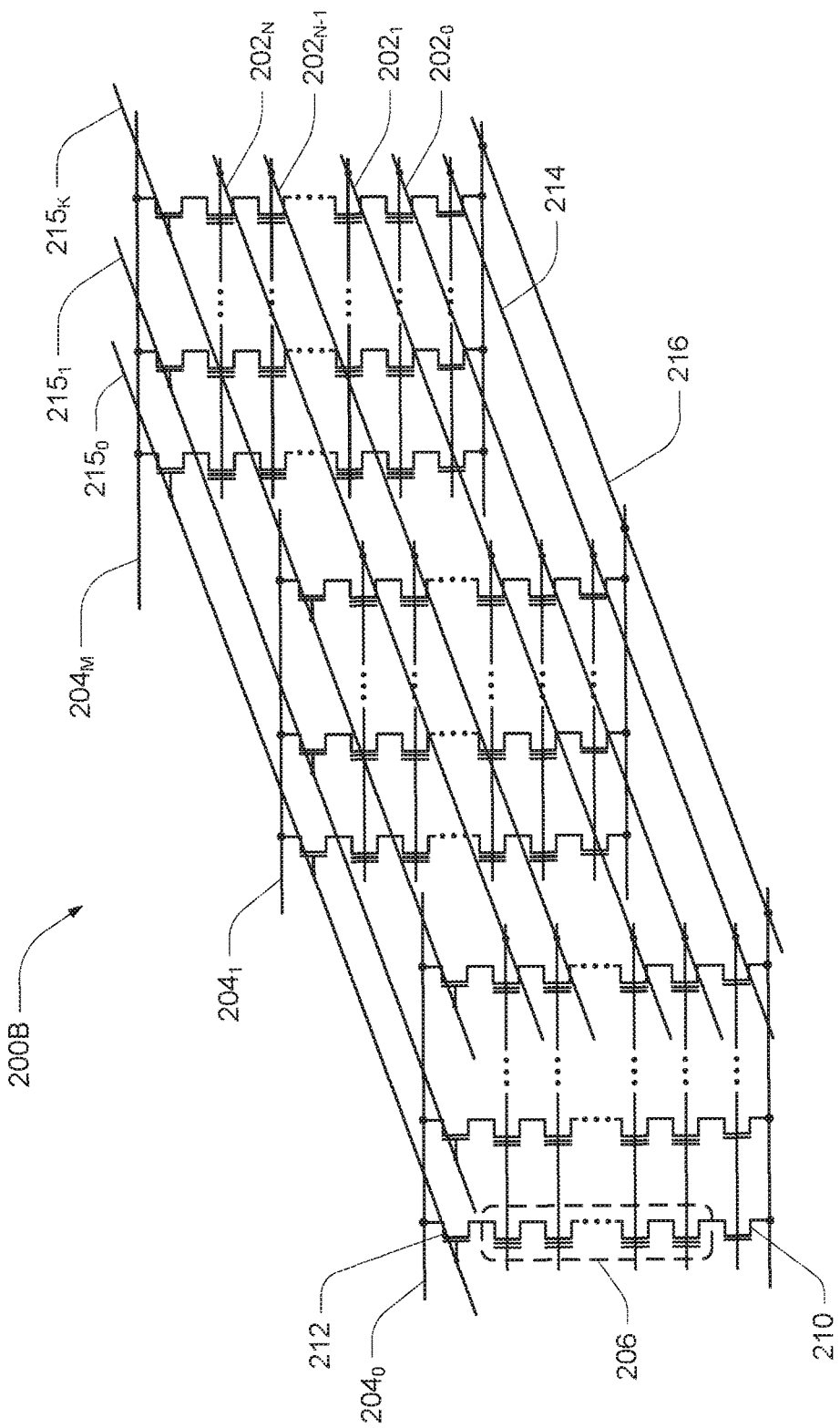

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line $204_0$-$204_M$ by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3A:
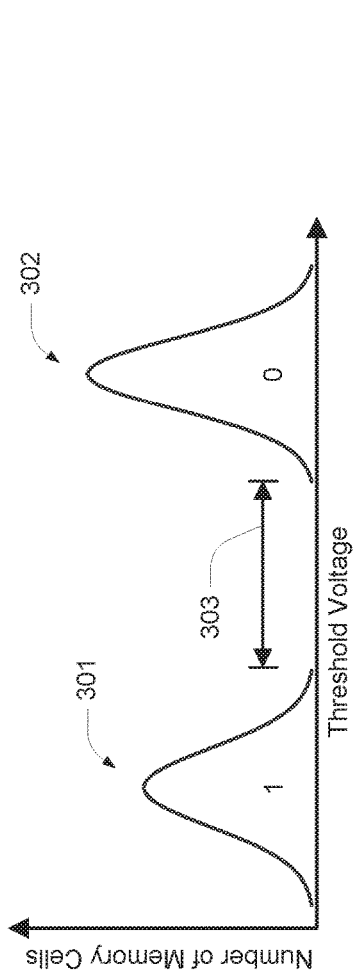
FIG. 3A illustrates an example of threshold voltage distributions for a population of single-level memory cells.

FIG. 3A illustrates an example of threshold voltage distributions for a population of one-bit SLC memory cells. Although typically referred to as single-level memory cells, such a memory cell might be programmed to a threshold voltage (Vt) that falls within one of two different threshold voltage distributions 301 or 302, each being used to represent a data state corresponding to the one bit of data. The threshold voltage distribution 301 typically has a greater width than the threshold voltage distribution 302 as memory cells are generally all placed in the data state corresponding to the threshold voltage distribution 301, then a subset of those memory cells are subsequently programmed to have a threshold voltage in the threshold voltage distribution 302. As programming operations are generally more incrementally controlled than erase operations, the threshold voltage distribution 302 may tend to have a tighter distribution. A dead space 303 (e.g., sometimes referred to as a margin, and might be 2V or greater) is typically maintained between the adjacent threshold voltage distributions 301 and 302 to keep the threshold voltage distributions from overlapping. As an example, if the threshold voltage of a memory cell is within the threshold voltage distribution 301, the memory cell in this case is storing a logical '1' data state and is typically referred to as the erased state of the memory cell. If the threshold voltage is within the threshold voltage distribution 302, the memory cell in this case is storing a logical '0' data state.

Figure 3B:
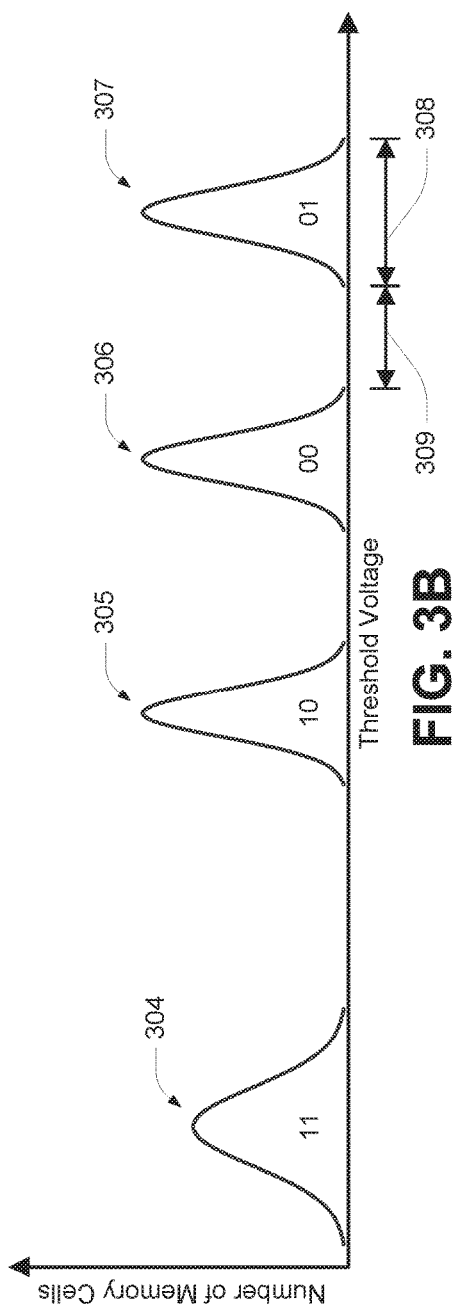
FIG. 3B illustrates an example of threshold voltage distributions for a population of multi-level memory cells.

FIG. 3B illustrates an example of threshold voltage distributions for a population of a four-level (e.g., two-bit) MLC memory cells. For example, such a memory cell might be programmed to a threshold voltage (Vt) that falls within one of four different threshold voltage distributions 304-307, each being used to represent a data state corresponding to a bit pattern comprised of two bits. The threshold voltage distribution 304 typically has a greater width than the remaining threshold voltage distributions 305-307 as memory cells are generally all placed in the data state corresponding to the threshold voltage distribution 304, then subsets of those memory cells are subsequently programmed to have threshold voltages in one of the threshold voltage distributions 305-307. As programming operations are generally more incrementally controlled than erase operations, these threshold voltage distributions 305-307 may tend to have tighter distributions.

The threshold voltage distributions 305-307 might each have a width 308, e.g., a width of 750 mV. In addition, a dead space 309 (e.g., sometimes referred to as a margin, and might be approximately 500 mV or greater) is typically maintained between adjacent threshold voltage distributions 304-307 to keep the threshold voltage distributions from overlapping. As an example, if the threshold voltage of a memory cell is within the first of the four threshold voltage distributions 304, the memory cell in this case is storing a logical '11' data state and is typically referred to as the erased state of the memory cell. If the threshold voltage is within the second of the four threshold voltage distributions 305, the memory cell in this case is storing a logical '10' data state. A threshold voltage in the third threshold voltage distribution 306 would indicate that the memory cell in this case is storing a logical '00' data state. Finally, a threshold voltage residing in the fourth threshold voltage distribution 307 indicates that a logical '01' data state is stored in the memory cell.

As previously noted, a portion of an array of memory cells of a memory might be pre-programmed with data prior to connecting that memory to other circuitry, e.g., such as connecting the memory device 100 to the processor 130 as depicted in FIG. 1, or connecting the memory device 100 to a circuit board (not shown). This data may be prone to experiencing charge loss due to exposures to high levels of heat, such as experienced during reflow soldering techniques, or due to extended periods of usage, such as experienced in embedded systems designed for extended usage life. Charge loss can cause read errors for an end-user.

One method used to improve reliability of such data is to utilize memory cells programmed as SLC memory cells, due to its generally larger dead space relative to MLC memory cells. Another method used to improve reliability of such pre-programmed data is to utilize memory cells programmed as MLC memory cells, but to utilize fewer than the intended number of data states for the memory cells storing that data. For example, memory cells of a four-level MLC such as described in FIG. 3B might be operated using a method of storage often referred to as padding, which programs a memory cell to either the data state corresponding to the threshold voltage distribution 304 corresponding to the erased state to represent one data value (e.g., a logical '1' data state), or to the data state corresponding to the threshold voltage distribution 307 (e.g., the highest threshold voltage distribution) to represent a different data value (e.g., a logical '0' data state). Such padding can provide further margin between data states than operating the memory cell as standard SLC.

Another technique used to improve reliability of such pre-programmed data is to program multiple copies of data/data complement pairs. For example, a byte of data, e.g., 01100101, and its complement, e.g., 10011010 might both be programmed to a page of memory cells. Upon reading the page of memory cells, the data and its complement might be subjected to an XOR operation to determine whether each bit of the read data byte is the complement of its corresponding bit of the read data complement byte. If the XOR operation confirms that each bit of the read data byte is the complement of its corresponding bit of the read data complement byte, the data byte can be deemed to be valid. Otherwise it might be deemed to be invalid. Multiple copies of such data/data complement pairs might be stored to the page of memory cells, or to additional pages of memory cells, to increase the probability that a valid data/data complement pair can be found.

Despite using one or more of such techniques of improving reliability, charge loss may still result in a failure to identify valid data for each byte of the pre-programmed data. Such pre-programmed data often contains initialization parameters for the memory, such as configuration data, including voltage levels, control signals, timing parameters, quantities, options, etc. Where no valid copy of configuration data is identified, the memory may be deemed to be unusable or may simply fail to operate. Various embodiments seek to mitigate such charge loss failures by reading data from a grouping of memory cells (e.g., in a page of memory cells also containing configuration data or other data for use by the memory device, or by a host or user of the memory device), and responding to a difference, if any, between the number of read memory cells of that grouping of memory cells having a particular data state relative to an expected number of memory cells of that grouping of memory cells programmed to have the particular data state.

Typical data structures of memory, e.g., of a logical page of memory cells, include storage areas for different types of data. For example, the data structure may include memory cells for storage of user data, e.g., data that is configured to be written to and read from the memory by a user of the memory, and memory cells for storage of overhead data, e.g., data that is configured to be used internally by the memory and is generally unavailable to a user of the memory using a standard read operation. Overhead data associated with the user data might include data generated by the memory in response to a write command received by the memory. For example, overhead data might include status indicators, error correction code data, mapping information and the like. As one example, a data structure might contain 16 KB of memory cells in a user data portion and 2 KB of memory cells in an overhead data portion. Although a memory may be configured to provide limited or no access to pre-programmed data, such as data corresponding to configuration parameters, this pre-programmed data may be stored to the memory using the same types of data structures (e.g., the same data structures) used in the memory for storing user data. Typically, only the user data portion of the data structure is utilized for storing such pre-programmed data, while the overhead data portion may be unused.

FIGS. 4A-4B illustrate examples of data structures that might be used with embodiments. FIG. 4A might represent the data structure of a grouping of memory cells 400A (e.g., a logical page of memory cells, which may also be the physical page of memory cells containing that logical page of memory cells) for use with embodiments. The grouping of memory cells 400A includes a subset of memory cells 440. The subset of memory cells 440 might correspond to a user data portion of a page of memory cells. The subset of memory cells 440 may store configuration data (e.g., for a memory containing the grouping of memory cells 400A), data for use by a user of the memory, and/or data for use by an external device (e.g., a host or other external controller of the memory). Although data stored to the subset of memory cells 440 may be known at the time of programming data to those memory cells, the memory containing the grouping of memory cells 400A would generally have no indication as to the values of that data other than from the memory cells of the subset of memory cells 440 themselves, or from memory cells of an array of memory cells containing the grouping of memory cells 400A that were programmed to contain duplicate copies of that data or its complement.

The grouping of memory cells 400A further includes a subset of memory cells 442, e.g., that is mutually exclusive from the subset of memory cells 440. The subset of memory cells 442 might correspond to an overhead data portion of a page of memory cells. Unlike the subset of memory cells 440, the subset of memory cells 442 store data having a predetermined (e.g., known) number of memory cells that were programmed to contain a particular data state. Control circuitry of a memory containing the grouping of memory cells 400A may be configured to make decisions responsive to a number of memory cells of the subset of memory cells 442 having the particular data state (e.g., determined in response to a read operation on the grouping of memory cells 400A) relative to thresholds (e.g., corresponding to numbers of memory cells) that are less than or equal to the predetermined number. The memory cells of the subset of memory cells 440 and/or the subset of memory cells 442 may be programmed as SLC or MLC memory cells.

FIG. 4B might represent the data structure of a grouping of memory cells 400B (e.g., a logical page of memory cells, which may also be the physical page of memory cells containing that logical page of memory cells) for use with embodiments. Although the grouping of memory cells 400A depicted one contiguous (e.g., contiguous address space of a page of memory cells) subset of memory cells 440, the grouping of memory cells 400B includes a plurality of subsets of memory cells $440_0$-$440_S$, which may collectively correspond to the subset of memory cells 440. The plurality of subsets of memory cells $440_0$-$440_S$ might correspond to a user data portion of a page of memory cells. The plurality of subsets of memory cells $440_0$-$440_S$ may collectively store configuration data (e.g., for a memory containing the grouping of memory cells 400B), data for use by a user of the memory, and/or data for use by an external device (e.g., a host or other external controller of the memory). Although data stored to the plurality of subsets of memory cells $440_0$-$440_S$ may be known at the time of programming data to those memory cells, the memory containing the grouping of memory cells 400B would generally have no indication as to the values of that data other than from the memory cells of the plurality of subsets of memory cells $440_0$-$440_S$ themselves, or from memory cells of an array of memory cells containing the grouping of memory cells 400B that were programmed to contain duplicate copies of that data or its complement.

Although the grouping of memory cells 400A depicted one contiguous (e.g., contiguous address space of a page of memory cells) subset of memory cells 442, the grouping of memory cells 400B includes a plurality of subsets of memory cells $442_0$-$442_S$, which may collectively correspond to the subset of memory cells 442. The plurality of subsets of memory cells $442_0$-$442_S$ might correspond to an overhead data portion of a page of memory cells. Unlike the plurality of subsets of memory cells $440_0$-$440_S$, the plurality of subsets of memory cells $442_0$-$442_S$ store data having a predetermined (e.g., known) number of memory cells that were programmed to contain a particular data state. Control circuitry of a memory containing the grouping of memory cells 400B may be configured to make decisions responsive to a number of memory cells of the plurality of subsets of memory cells $442_0$-$442_S$ having the particular data state (e.g., determined in response to a read operation on the grouping of memory cells 400B) relative to thresholds (e.g., corresponding to numbers of memory cells) that are less than or equal to the predetermined number. The memory cells of the plurality of subsets of memory cells $440_0$-$440_S$ and/or the plurality of subsets of memory cells $442_0$-$442_S$ may be programmed as SLC or MLC memory cells. Distribution of the data of a subset of memory cells 442 may provide better representation of the expected behavior of the data of a subset of memory cells 440.

Although the groupings of memory cells 400A and 400B are each depicted to contain a same number of subsets of memory cells for each type of data within their respective grouping (e.g., one for the grouping of memory cells 400A, and S+1 for the grouping of memory cells 400B), differing numbers may be used as embodiments described herein are not dependent upon a number of subsets of memory cells for either type of data. Similarly, the relative location and/or sizes of individual subsets of memory cells for the different types of data may be altered as embodiments described herein are not dependent upon the location of a memory cell for either type of data, and are not dependent upon the size of a subset of memory cells for either type of data.

Figure 5A:
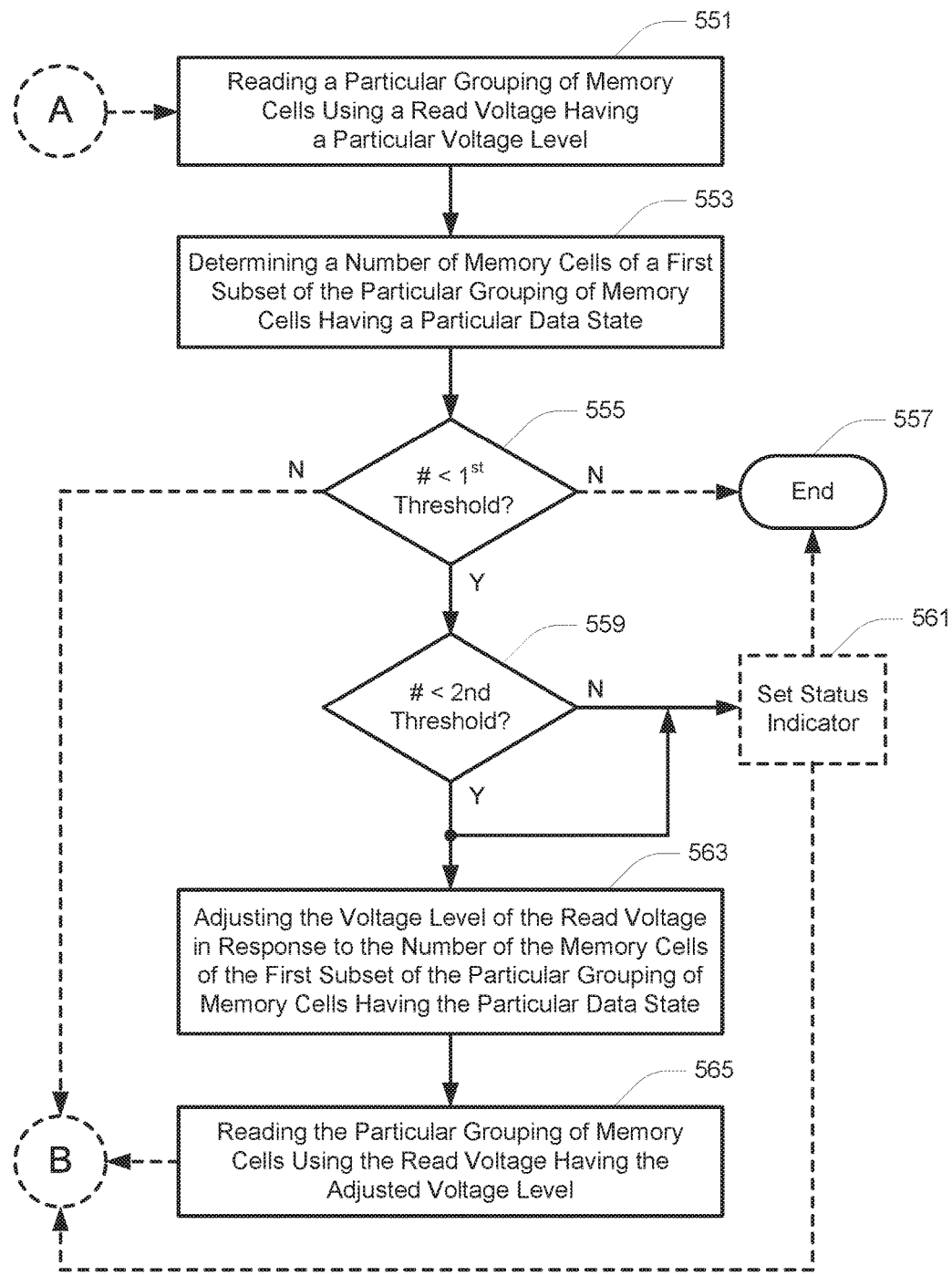
FIGS. 5A-5D depict flowcharts of methods of operating a memory in accordance with embodiments.
Figure 5B:
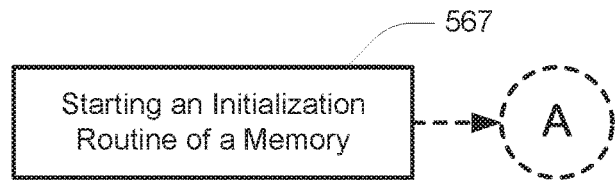

FIGS. 5A-5D depict flowcharts of methods of operating a memory in accordance with embodiments. In FIG. 5A, at 551, a particular grouping of memory cells is read using a read voltage having a particular voltage level. The particular grouping of memory cells might correspond to the memory cells of a data structure of a page of memory cells, e.g., data structures 400A or 400B of FIG. 4A or 4B, respectively, and a read voltage level (e.g., a default read voltage level) might be used to determine whether memory cells of the page of memory cells have the particular data state. With reference to FIG. 3A as an example, a read voltage level within the dead space 303 might be used to determine whether a memory cell has a data state corresponding to the range of threshold voltages 302, e.g., a logical '0' data state. With reference to FIG. 3B as another example, a read voltage level within the labeled dead space 309 might be used to determine whether a memory cell has a data state corresponding to the range of threshold voltages 307, e.g., a logical '01' data state or, if using padding, a logical '0' data state. Although the methods of FIGS. 5A-5D are applicable to the use of SLC or MLC memory cells (with or without the use of padding), the remaining discussion of FIGS. 5A-5C will refer to the example of FIG. 3A for simplicity.

At 553, a number of the memory cells of a subset (e.g., first subset) of memory cells of the particular grouping of memory cells having a particular data state is determined. The first subset of memory cells might correspond to those memory cells of the overhead data portion of a page of memory cells having the data structure 400A (e.g., subset of memory cells 442) or 400B (e.g., subsets of memory cells 442$_0$-442$_S$), for example. Referring again to the example of FIG. 3A, the number of memory cells of the first subset of memory cells having the logical '0' data state might be determined. Alternatively, a number of memory cells of the first subset of memory cells having any data state other than the particular data state might be determined, which would thus determine the number of memory cells having the particular data state. For some embodiments, each memory cell of the first subset of memory cells might be programmed to have the particular data state.

At 555, a decision is made whether the number of memory cells of the first subset of memory cells having the particular data state is less than a first threshold (e.g., less than a first integer value). If the number of memory cells of the first subset of memory cells having the particular data state is not less than the first threshold, the method may end at 557. Alternatively, the method may proceed to point B, and thus to 569 of FIG. 5C to be described infra. The first threshold might be equal to the expected number of memory cells of the first subset of memory cells that should have the particular data state. This value might be equal to the number of memory cells in the first subset of memory cells, or it may be less than the number of memory cells in the first subset of memory cells. In addition, where the number of memory cells of the first subset of memory cells having the particular data state is determined by determining the number of memory cells of the first subset of memory cells having any data state other than the particular data state, determining whether the number of memory cells of the first subset of memory cells having the particular data state is less than the first threshold might entail determining whether the number of memory cells of the first subset of memory cells having any data state other than the particular data state is greater than or equal to some threshold corresponding to the number (e.g., total number) of memory cells of the first subset of memory cells minus an integer value (e.g., the first integer value) corresponding to the first threshold.

If the number of memory cells of the first subset of memory cells having the particular data state is less than the first threshold at 555, the method may proceed to 559, where a decision is made whether the number of memory cells of the first subset of memory cells having the particular data state is less than a second threshold (e.g., less than a second integer value) that is less than the first threshold (e.g., less than the first integer value). If the number of memory cells of the first subset of memory cells having the particular data state is not less than the second threshold, the method may proceed to 561 to set a status indicator. The status indicator may be used to provide an indication to an external device, e.g., a host device or other external controller, that data of the memory is deemed to be experiencing some level (e.g., minimum level) of errors (e.g., one or more errors) resulting from charge loss. The method may then end at 557, or it may alternately proceed to point B, and thus to 569 of FIG. 5C. Where the number of memory cells of the first subset of memory cells having the particular data state is determined by determining the number of memory cells of the first subset of memory cells having any data state other than the particular data state, determining whether the number of memory cells of the first subset of memory cells having the particular data state is less than the second threshold might entail determining whether the number of memory cells of the first subset of memory cells having any data state other than the particular data state is greater than or equal to some threshold corresponding to the number (e.g., total number) of memory cells of the first subset of memory cells minus an integer value (e.g., the second integer value) corresponding to the second threshold.

If the number of memory cells of the first subset of memory cells having the particular data state is less than the second threshold, the method may proceed to 561 to set the status indicator, and may also proceed to 563. Although a value of the status indicator may be the same whether the number of memory cells of the first subset of memory cells having the particular data state is only less than the first threshold, or whether the number of memory cells of the first subset of memory cells having the particular data state is also less than the second threshold, differing values of the status indicator might be used to provide different levels of warning regarding the extent to which the data of the memory is deemed to be experiencing charge loss errors.

At 563, the voltage level of the read voltage is adjusted in response to the number of memory cells of the first subset of memory cells having the particular data state. In general, decreasing voltage levels of the read voltage would be selected for decreasing numbers of memory cells of the first subset of memory cells having the particular data state. For example, if the number of memory cells of the first subset of memory cells having the particular data state is less than the second threshold, but greater than or equal to a third threshold (e.g., a third integer value), the voltage level of the read voltage might be adjusted to a first adjusted voltage level, e.g., a voltage level less than the particular (e.g., default) voltage level. If the number of memory cells of the first subset of memory cells having the particular data state is less than the third threshold, but greater than or equal to a fourth threshold (e.g., a fourth integer value), the voltage level of the read voltage might be adjusted to a second adjusted voltage level, e.g., a voltage level less than the first adjusted voltage level. If the number of memory cells of the first subset of memory cells having the particular data state is less than the fourth threshold, but greater than or equal to a fifth threshold (e.g., a fifth integer value), the voltage level of the read voltage might be adjusted to a third adjusted voltage level, e.g., a voltage level less than the second adjusted voltage level. This may be repeated for additional thresholds, selecting a successively lower adjusted voltage level for each threshold. For some embodiments, if the number of memory cells of the first subset of memory cells having the particular data state is less than a particular threshold, a fail status might be indicated. At 565, the particular grouping of memory cells is read (e.g., re-read) using the read voltage having the adjusted voltage level. The method may optionally proceed to point B, and thus to 569 of FIG. 5C.

The method described with reference to FIG. 5A may be part of an initialization routine of a memory. Thus, with reference to FIG. 5B, an initialization routine of the memory might be started at 567, and then proceed to point A, and thus 551 of FIG. 5A. An initialization routine may be performed in response to a reset or power-up of the memory, for example.

In addition, the method described with reference to FIG. 5A was described to optionally proceed to point B, and thus to 569 of FIG. 5C to continue an initialization routine of the memory, where it may be determined whether memory cells of a second subset of memory cells of the particular grouping of memory cells (e.g., mutually exclusive of the firsts subset of memory cells) contain valid data. The second subset of memory cells might correspond to those memory cells of the user data portion of a page of memory cells having the data structure 400A (e.g., subset of memory cells 440) or 400B (e.g., subsets of memory cells $440_0$-$440_5$), for example. This might include using data/data complement pairs and performing an XOR operation as described supra, where the memory cells of the second subset of memory cells might be deemed to contain valid data if, for each digit or other unit (e.g., byte) of the data, a valid data/data complement pair is identified, e.g., where a read digit of data of the data/data complement pair has a data state of 0 or 1, and its corresponding read digit of data complement of the data/data complement pair has a data state of 1 or 0, respectively.

At 571, if the memory cells of the second subset of memory cells are deemed to not contain valid data, the memory may indicate a fail status at 573 and the initialization routine might end. Note that if copies of the data (e.g., data/data complement pairs) of the second subset of memory cells are also stored an additional grouping of memory cells (e.g., one or more additional pages of memory cells), the memory may not indicate a fail status at 573 unless no valid copy of the data may be identified. If the memory cells of the second subset of memory cells are deemed to contain valid data at 571, the initialization routine may continue, e.g., to completion, at 575, and end at 577. Similarly, if the particular grouping of memory cells is one of a plurality of groupings of memory cells containing data used by the initialization routine, the initialization routine may not continue to completion until each grouping of memory cells of the plurality of groupings of memory cells has been processed. For some embodiments, after completion of the initialization routine, the method might proceed to point C, and thus 581 of FIG. 5D.

Figure 5C:
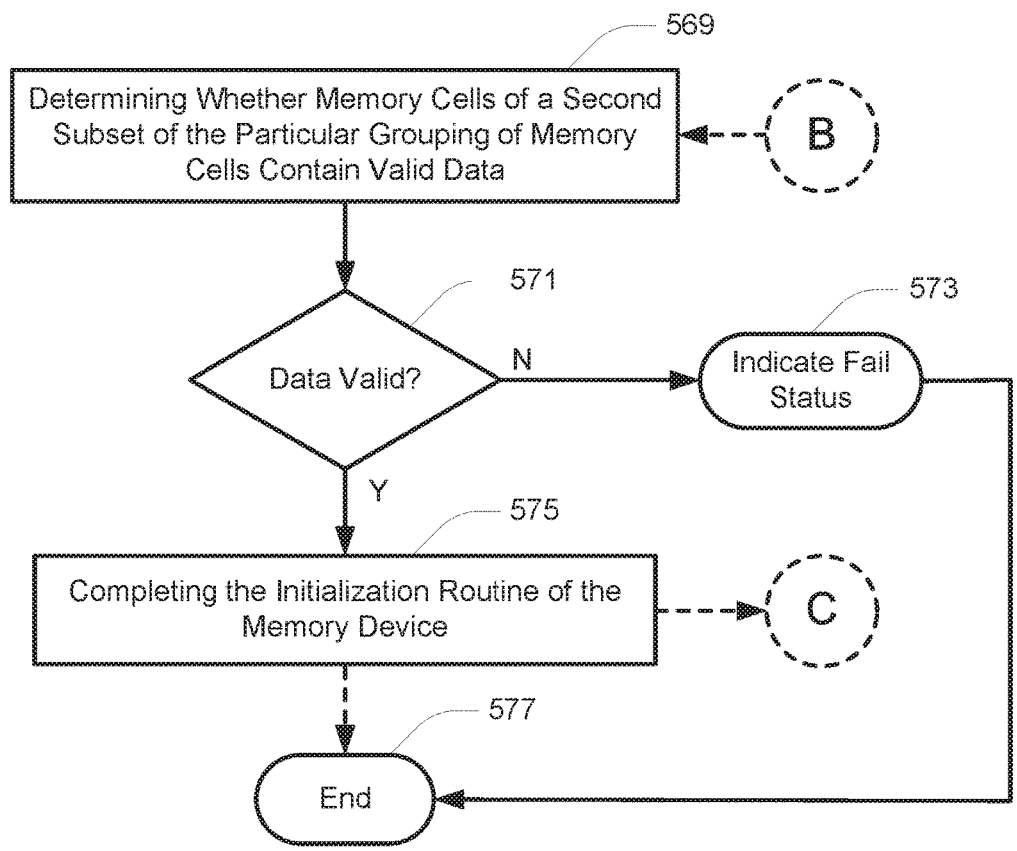
Figure 5D:
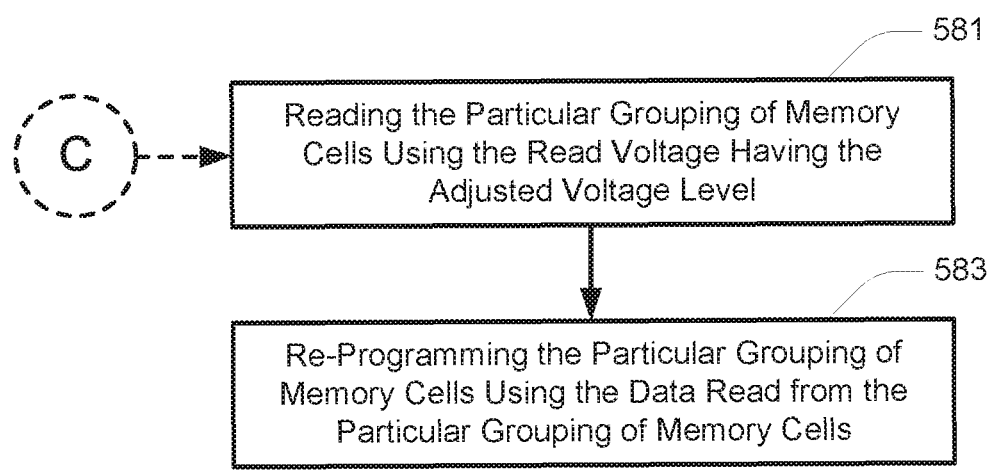

At 581 of FIG. 5D, the particular grouping of memory cells might be read (e.g., re-read) using the read voltage having the adjusted voltage level. The particular grouping of memory cells might then be re-programmed at 583 using the data read from the particular grouping of memory cells. This might facilitate restoring lost charge to those memory cells intended to have the particular data state such that a subsequent read operation using the default read voltage level might be more successful. Memory cells of the first subset of memory cells might be programmed such that each memory cell of the first subset of memory cells intended to have the particular data state might be re-programmed to have the particular data state regardless of whether the read data for that memory cell indicated the particular data state or another data state. This could include re-programming each memory cell of the first subset of memory cells to have the particular data state regardless of their read data states. Because the re-programming can be used to restore lost charge to memory cells indicating a data state lower than their intended data state, re-programming can be performed without performing an erase operation on those memory cells prior to re-programming.

While the method of FIG. 5D was shown to follow from completion of an initialization routine at 575 of FIG. 5C, this method might also be initiated in response to a command received from an external device, e.g., a host device or other external controller. Similarly, the method beginning at 583 might proceed directly from 565 of FIG. 5A. For some embodiments, the method of FIG. 5D might be performed only if the adjusted voltage level corresponds to a particular (e.g., lowest) adjusted voltage level of the method. For example, if the number of memory cells of the first subset of memory cells having the particular data state is greater than or equal to a particular threshold (e.g., a threshold below which might indicate a fail status of the memory), but less than a next higher threshold, re-programming the particular grouping of memory cells at 583 might be performed, but if the number of memory cells of the first subset of memory cells having the particular data state is greater than or equal to that next higher threshold, re-programming might not be performed.

The particular grouping of memory cells may be one of a plurality of groupings of memory cells storing pre-programmed data such as configuration data. For example, multiple pages of memory cells might be used to store such data. The methods of FIGS. 5A-5D might be performed for each of these groupings of memory cells, and each might have a respective adjusted voltage level for the read voltage for that grouping of memory cells, e.g., where the extent of charge loss for one grouping of memory cells differs from the extent of charge loss for another grouping of memory cells. Similarly, the first subset of memory cells might be programmed to contain more than one programmed data state. In such an embodiment, each data state might have a corresponding voltage level (e.g., default voltage level) for identifying its corresponding data state. Similarly, different thresholds, and different levels of adjusted voltage level for the read voltage, might be used for each data state.

Values of the thresholds might be determined experimentally, empirically or through simulation. For example, a memory could be exposed to different temperatures and/or other stresses to mimic an expected usage model of an end user. After each stress, the threshold voltage distribution of the memory cells might be measured and characterized.

Such data could then be used to identify thresholds, and their corresponding adjusted voltage levels, that would be expected to result in valid data. As an example, adjusted voltage levels might be set to nominal levels, e.g., setting the first adjusted voltage level to be 100 mV below the default read voltage level, setting the second adjusted voltage level to be 100 mV below the first adjusted voltage level, setting the third adjusted voltage level to be 100 mV below the second adjusted voltage level, etc. The thresholds could then be set based on the characterization of what levels of shift in the threshold voltage distribution might produce differing numbers of erroneous indications of the particular data state for the first subset of memory cells read using the default read voltage level. For example, such data could be used to determine what number of erroneous indications of the particular data state using the default read voltage level would produce a shift (e.g., a largest shift) that could be reliably read using each of the adjusted voltage levels.

Figure 6:
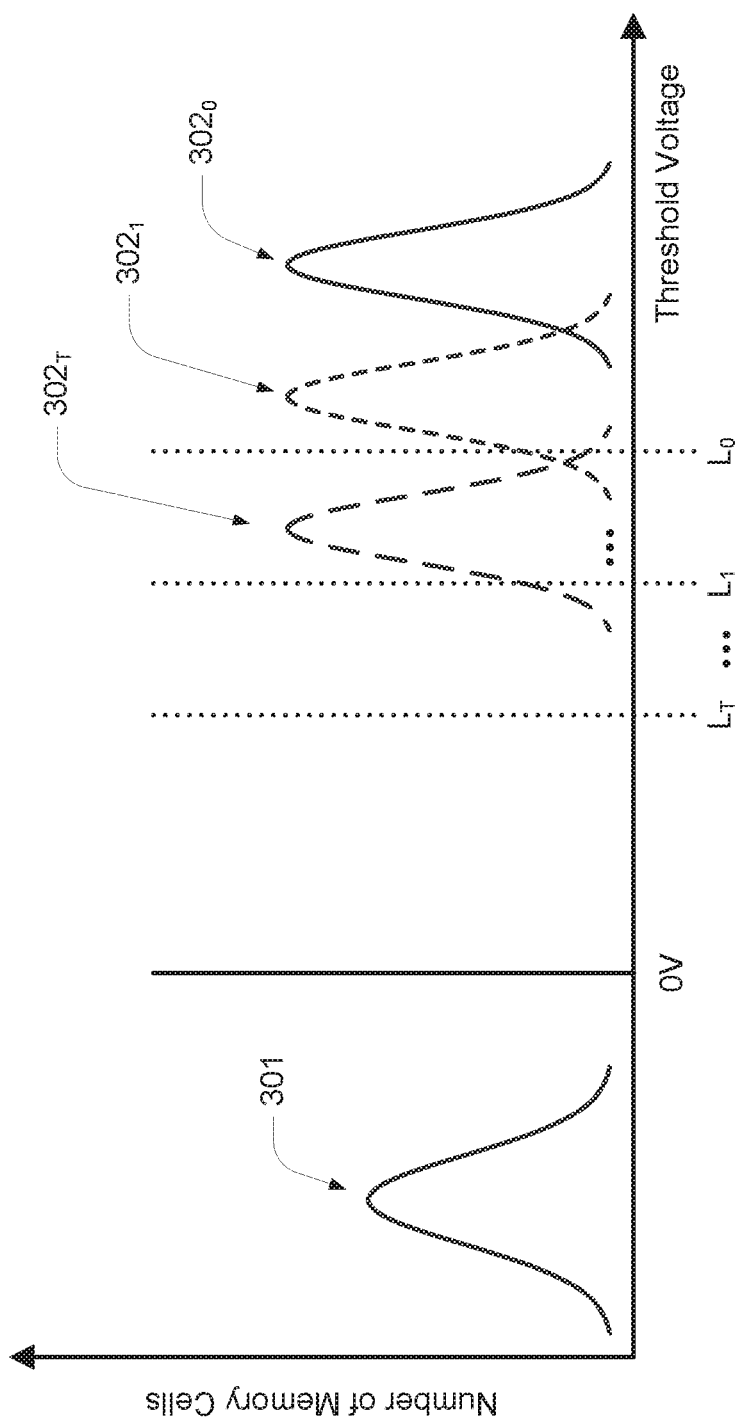
FIG. 6 illustrates adjustment of a read voltage level in accordance with an embodiment.

FIG. 6 illustrates adjustment of a read voltage level in accordance with an embodiment. The threshold voltage distribution 301 might correspond to the threshold voltage distribution 301 of FIG. 3A. The threshold voltage distribution $302_0$ might correspond to the threshold voltage distribution 302 of FIG. 3A, e.g., as programmed. The threshold voltage distribution $302_1$ might correspond to the threshold voltage distribution $302_0$ shifted in response to one level of stress. The threshold voltage distribution $302_T$ might correspond to the threshold voltage distribution $302_0$ shifted in response to different level of stress. Fewer or more threshold voltage distributions might be characterized.

Each of the threshold voltage distributions $302_0$-$302_T$ might have a corresponding read voltage level expected to reliably read memory cells having that threshold voltage distribution. For example, if T=2, the read voltage level $L_0$ might correspond to the default read voltage level, the read voltage level $L_1$ might correspond to a first adjusted voltage level, and the read voltage level $L_T$ might correspond to a second adjusted voltage level. In such an example, a first threshold might be equal to the number of memory cells expected to have the particular data state corresponding to the threshold voltage distribution $302_0$, a second threshold might be equal to a number of memory cells having the threshold voltage distribution $302_1$ and having the particular data state when read using the default read voltage level $L_0$, and a third threshold might be equal to a number of memory cells having the threshold voltage distribution $302_T$ and having the particular data state when read using the default read voltage level $L_0$.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
   reading a particular grouping of memory cells using a read voltage having a particular voltage level;
   determining a number of memory cells of a subset of memory cells of the particular grouping of memory cells having a particular data state; and
   if the number of memory cells of the subset of memory cells having the particular data state is less than a particular threshold:
     adjusting a voltage level of the read voltage in response to the number of memory cells of the subset of memory cells having the particular data state; and
     reading the particular grouping of memory cells using the read voltage having the adjusted voltage level;
   wherein adjusting the voltage level of the read voltage in response to the number of memory cells of the subset of memory cells having the particular data state comprises:
     adjusting the voltage level of the read voltage to a first adjusted voltage level less than the particular voltage level if the number of memory cells of the subset of memory cells having the particular data state is less than the particular threshold and greater than or equal to a different threshold that is less than the particular threshold; and
     adjusting the voltage level of the read voltage to a second adjusted voltage level less than the first adjusted voltage level if the number of memory cells of the subset of memory cells having the particular data state is less than the different threshold and greater than or equal to an additional threshold that is less than the different threshold.

2. A method of operating a memory, comprising:
   reading a particular grouping of memory cells using a read voltage having a particular voltage level;
   determining a number of memory cells of a subset of memory cells of the particular grouping of memory cells having a particular data state; and
   if the number of memory cells of the subset of memory cells having the particular data state is less than a particular threshold:
     adjusting a voltage level of the read voltage in response to the number of memory cells of the subset of memory cells having the particular data state; and
     reading the particular grouping of memory cells using the read voltage having the adjusted voltage level;
   wherein the particular threshold is a second threshold, and wherein adjusting the voltage level of the read voltage in response to the number of memory cells of the subset of memory cells having the particular data state comprises:
     adjusting the voltage level of the read voltage to a first adjusted voltage level less than the particular voltage level if the number of memory cells of the subset of memory cells having the particular data state is less than the second threshold and greater than or equal to a third threshold that is less than the second threshold; and
     for each value of X=2 through Y, where X and Y are each integers, and Y is greater than or equal to 2:
       adjusting the voltage level of the read voltage to an $X^{th}$ adjusted voltage level less than an $(X-1)^{th}$ adjusted voltage level if the number of memory cells of the subset of memory cells having the particular data state is less than an $(X+1)^{th}$ threshold and greater than or equal to an $(X+2)^{th}$ threshold that is less than the $(X+1)^{th}$ threshold.

3. The method of claim 2, further comprising indicating a fail status of the memory if the number of memory cells of the subset of memory cells having the particular data state is less than the $(X+2)^{th}$ threshold when X=Y.

4. The method of claim 2, further comprising re-programming the particular grouping of memory cells in response to the data read from the particular grouping of memory cells using the read voltage having the adjusted voltage level if the number of memory cells of the subset of memory cells having the particular data state is less than a $Z^{th}$ threshold, where Z is an integer value less than or equal to Y+1.

5. The method of claim 4, wherein re-programming the particular grouping of memory cells in response to the data read from the particular grouping of memory cells using the read voltage having the adjusted voltage level comprises re-programming the memory cells of the subset of memory cells to have the particular data state regardless of the data states of their read data.

6. A method of operating a memory, comprising:
reading a particular grouping of memory cells using a read voltage having a particular voltage level;
determining a number of memory cells of a subset of memory cells of the particular grouping of memory cells having a particular data state; and
if the number of memory cells of the subset of memory cells having the particular data state is less than a particular threshold:
adjusting a voltage level of the read voltage in response to the number of memory cells of the subset of memory cells having the particular data state; and
reading the particular grouping of memory cells using the read voltage having the adjusted voltage level;
wherein determining the number of memory cells of the subset of memory cells having the particular data state comprises determining a number of memory cells of the subset of memory cells having a data state corresponding to a highest threshold voltage distribution to which those memory cells are configured to be programmed.

7. A method of operating a memory, comprising:
reading a particular grouping of memory cells using a read voltage having a particular voltage level as part of an initialization routine of the memory; and
determining a number of memory cells of a subset of memory cells of the particular grouping of memory cells having a particular data state; and
if the number of memory cells of the subset of memory cells having the particular data state is less than a particular threshold:
adjusting a voltage level of the read voltage in response to the number of memory cells of the subset of memory cells having the particular data state;
reading the particular grouping of memory cells using the read voltage having the adjusted voltage level; and
continuing the initialization routine after reading the particular grouping of memory cells using the read voltage having the adjusted voltage level.

8. A method of operating a memory, comprising:
reading a particular grouping of memory cells using a read voltage having a particular voltage level;
determining a number of memory cells of a subset of memory cells of the particular grouping of memory cells having a particular data state; and
if the number of memory cells of the subset of memory cells having the particular data state is less than a particular threshold:
adjusting a voltage level of the read voltage in response to the number of memory cells of the subset of memory cells having the particular data state; and
reading the particular grouping of memory cells using the read voltage having the adjusted voltage level;
wherein determining the number of memory cells of the subset of memory cells having the particular data state comprises determining a number of memory cells of the subset of memory cells having any data state other than the particular data state.

9. The method of claim 8, further comprising determining if the number of memory cells of the subset of memory cells having the particular data state is less than the particular threshold by determining whether the number of memory cells of the first subset of memory cells having any data state other than the particular data state is greater than or equal to a threshold corresponding to a number of memory cells of the first subset of memory cells minus an integer value corresponding to the particular threshold.

10. A method of operating a memory, comprising:
starting an initialization routine of the memory;
reading a particular grouping of memory cells of the memory using a read voltage having a particular voltage level;
determining a number of memory cells of a first subset of memory cells of the particular grouping of memory cells having a particular data state;
if the number of memory cells of the first subset of memory cells having the particular data state is less than a particular threshold:
adjusting a voltage level of the read voltage in response to the number of memory cells of the subset of memory cells having the particular data state; and
reading the particular grouping of memory cells using the read voltage having the adjusted voltage level;
determining whether memory cells of a second subset of memory cells of the particular grouping of memory cells contain valid data, where the second subset of memory cells is mutually exclusive from the first subset of memory cells; and
if the memory cells of the second subset of memory cells are determined to contain valid data, continuing the initialization routine.

11. The method of claim 10, wherein the first subset of memory cells comprises a first plurality of mutually-exclusive subsets of memory cells, wherein the second subset of memory cells comprises a second plurality of mutually-exclusive subsets of memory cells, and wherein a subset of memory cells of the first plurality of mutually-exclusive subsets of memory cells is in an address space between two adjacent subsets of memory cells of the second plurality of mutually-exclusive subsets of memory cells.

12. The method of claim 10, further comprising indicating a fail status of the memory if the memory cells of the second subset of memory cells are determined to not contain valid data.

13. The method of claim 12, further comprising indicating the fail status of the memory if the memory cells of the second subset of memory cells are determined to not contain valid data only when no grouping of memory cells of the memory contains a valid copy of the data stored in the second subset of memory cells.

14. The method of claim 10, further comprising:
after completing the initialization routine, reading the particular grouping of memory cells using the read voltage having the adjusted voltage level; and
re-programming the second subset of memory cells using the data read from the particular grouping of memory cells using the read voltage having the adjusted voltage level.

15. The method of claim 14, further comprising re-programming the first subset of memory cells using the data read from the particular grouping of memory cells.

16. The method of claim 14, further comprising re-programming the first subset of memory cells to have the particular data state.

17. The method of claim 10, wherein the particular threshold is a second threshold, and wherein adjusting the voltage level of the read voltage in response to the number of memory cells of the subset of memory cells having the particular data state comprises:
adjusting the voltage level of the read voltage to a first adjusted voltage level less than the particular voltage level if the number of memory cells of the subset of memory cells having the particular data state is less than the second threshold and greater than or equal to a third threshold that is less than the second threshold; and
adjusting the voltage level of the read voltage to a second adjusted voltage level less than the first adjusted voltage level if the number of memory cells of the subset of memory cells having the particular data state is less than the third threshold and greater than or equal to a fourth threshold that is less than the third threshold.

18. The method of claim 17, wherein the particular threshold is a second threshold, and wherein adjusting the voltage level of the read voltage in response to the number of memory cells of the subset of memory cells having the particular data state comprises:
adjusting the voltage level of the read voltage to a first adjusted voltage level less than the particular voltage level if the number of memory cells of the subset of memory cells having the particular data state is less than the second threshold and greater than or equal to a third threshold that is less than the second threshold; and
adjusting the voltage level of the read voltage to a second adjusted voltage level less than the first adjusted voltage level if the number of memory cells of the subset of memory cells having the particular data state is less than the third threshold and greater than or equal to a fourth threshold that is less than the third threshold.

19. A method of operating a memory, comprising:
starting an initialization routine of the memory;
reading a page of memory cells of the memory using a read voltage having a default voltage level;
determining a number of memory cells of a first subset of memory cells of the page of memory cells having a particular data state;
if the number of memory cells of the first subset of memory cells having the particular data state is greater than or equal to a first threshold, continuing the initialization routine;
if the number of memory cells of the first subset of memory cells having the particular data state is less than a second threshold that is less than the first threshold, and greater than or equal to a third threshold that is less than the second threshold:
adjusting the voltage level of the read voltage to a first adjusted voltage level less than the default voltage level;
reading the page of memory cells using the read voltage having the first adjusted voltage level;
determining whether memory cells of a second subset of memory cells of the page of memory cells contain valid data, where the second subset of memory cells is mutually exclusive from the first subset of memory cells; and
if the memory cells of the second subset of memory cells are determined to contain valid data, continuing the initialization routine;
if the number of memory cells of the first subset of memory cells having the particular data state is less than the third threshold, and greater than or equal to a fourth threshold that is less than the third threshold:
adjusting the voltage level of the read voltage to a second adjusted voltage level less than the first adjusted voltage level;
reading the page of memory cells using the read voltage having the second adjusted voltage level;
determining whether the memory cells of the second subset of memory cells contain valid data; and
if the memory cells of the second subset of memory cells are determined to contain valid data, continuing the initialization routine.

20. The method of claim 19, further comprising indicating a fail status if the memory cells of the second subset of memory cells are determined to not contain valid data.

21. The method of claim 19, further comprising:
if the number of memory cells of the first subset of memory cells having the particular data state is less than the fourth threshold, and greater than or equal to a fifth threshold that is less than the fourth threshold:
adjusting the voltage level of the read voltage to a third adjusted voltage level less than the second adjusted voltage level;
reading the page of memory cells using the read voltage having the third adjusted voltage level;
determining whether the memory cells of the second subset of memory cells contain valid data; and
if the memory cells of the second subset of memory cells are determined to contain valid data, continuing the initialization routine.

22. The method of claim 19, further comprising:
after completing the initialization process, if the number of memory cells of the first subset of memory cells having the particular data state using the read voltage having the default voltage level is less than a particular threshold, reading the memory cells of the page of memory cells using the read voltage having a particular voltage level corresponding to the number of memory cells of the first subset of memory cells having the particular data state using the read voltage having the default voltage level being greater than or equal to the particular threshold and less than a next higher threshold, and re-programming the second subset of memory cells using the data read from the page of memory cells using the read voltage having the particular voltage level.

23. The method of claim 19, further comprising if the number of memory cells of the first subset of memory cells having the particular data state is less than the first threshold, setting a status indicator indicating that data of the memory is deemed to be experiencing errors resulting from charge loss.

24. The method of claim 19, further comprising:
if the number of memory cells of the first subset of memory cells having the particular data state is less than the first threshold and greater than or equal to the second threshold, setting a first status indicator indicating that data of the memory is deemed to be experiencing a first level of errors resulting from charge loss;

if the number of memory cells of the first subset of memory cells having the particular data state is less than the second threshold and greater than or equal to the third threshold, setting a second status indicator indicating that data of the memory is deemed to be experiencing a second level of errors resulting from charge loss; and if the number of memory cells of the first subset of memory cells having the particular data state is less than the third threshold and greater than or equal to the fourth threshold, setting a third status indicator indicating that data of the memory is deemed to be experiencing a third level of errors resulting from charge loss.

* * * * *